United States Patent [19]

Kuhn

[11] Patent Number: 4,978,866
[45] Date of Patent: Dec. 18, 1990

[54] RAMP CIRCUIT FOR CONTROL LOOP
[75] Inventor: John J. Kuhn, Gibsonia, Pa.
[73] Assignee: PPG Industries, Inc., Pittsburgh, Pa.
[21] Appl. No.: 214,367
[22] Filed: Jul. 1, 1988
[51] Int. Cl.$^5$ .......................... H03K 4/08; H03K 5/01; H03B 1/09
[52] U.S. Cl. .................................. 307/228; 307/260; 307/261; 307/263; 307/549
[58] Field of Search .................................. 307/260–261, 307/263, 228, 549; 328/184, 185

[56] References Cited
U.S. PATENT DOCUMENTS
3,058,013 10/1962 Acker .................................. 307/228

Primary Examiner—Stanley D. Miller
Assistant Examiner—Margaret Rose Wambach
Attorney, Agent, or Firm—Kenneth J. Stachel

[57] ABSTRACT

A ramp circuit for a control loop which receives a signal from a controller and sends a signal to a controllable means to limit the slew rate of the controller signal. A capacitor functions as a storage means and a reset means is provided to rapidly discharge the capacitor in the event of a decrease in power to the control loop. The capacitor is charged through a diode which limits discharge in normal operation. The discharge and reset is performed by a normally reverse biased diode and series resistance connected to the controller positive supply voltage. A current limiting means is provided to charge the capacitor a lower linear rate by turning on a transistor and shunting excess current around the capacitor. An external reset is provided by an additional diode and series resistance for connection to a remote positive supply voltage or relay contact. The output is buffered by an emitter follower to limit loading by the controllable means and protection circuitry to provide immunity to induced electrical currents at the output.

24 Claims, 2 Drawing Sheets

RAMP CIRCUIT FOR CONTROL LOOP

The present invention is directed to an electronic ramp circuit to limit the slew rate of the output from a controller to a controllable means in a control loop.

In control loop technology the controller typically sends a signal to a controllable means such as a power supply or final element. The signal adjusts the controllable means to modify a controlled variable in response to a sensed change in a monitored variable. Some controlled variables include temperature, pressure, fluid levels and the like.

In a control loop for controlling temperature of a fiber forming device, for instance a fiber glass bushing, the temperature of the fiber forming bushing utilizes a controller that compares the set point temperature to the actual temperature of the fiber forming bushing. A control signal typically between zero and 5 volts direct current is generated which is sent to a power pack or voltage regulator. The power pack or regulator applies up to 400–500 volts alternating current to a transformer which in turn supplies sufficient electrical energy to the fiber forming bushing to heat it to the desired set point temperature. The power pack can be a saturated core reactor type or a silicon-controlled rectifier type. When the former is used, the control signal from the controller usually ranges from zero to 80 volts. The controller receives the actual temperature of the fiber forming device through one or more thermocouples. An example of a typical controller utilized in controlling the temperature of a fiber forming device is that of U.S. Pat. No. 3,202,800 (Phillips, Sr. et al) hereby incorporated by reference. Under normal operating conditions the control system efficiently maintains the bushing at a desired temperature.

Under several situations, a typical control system can rapidly heat a bushing resulting in flooding of or possible damage to the bushing. The flooding occurs when the glass flows over the surface of the bushing and prevents the formation of individual filaments. Such a condition can occur when a power dip occurs within the fiber producing facility or to the power supplied to the fiber producing facility. Upon such an occurrence, control circuits can trip, and if the reset procedure is not performed to satisfaction, bushings can overheat. A natural response to the overheating situation is to spray water on the bushing to cool it. The controller, however, interprets such a reduction in temperature from a water spray as a need for more voltage which is supplied causing the bushing to overheat, and the end result is flooding of the bushing.

It is an object of the present invention to provide an electronic circuit in a control loop between a controller and a controllable means to limit the rate of increase of the controller signal and provide a threshold which the controller signal cannot exceed and to Provide a reset upon a reduction of electric power to the controller to allow for an increase at a controlled rate until the output equals the controller output voltage, and stabilize at the controller output voltage and prevent any further large, rapid increases in the controller signal. This all would be accomplished not only when starting up a cold bushing but also upon reheating a bushing after a loss or dip in electric power or upon reduction in temperature of the bushing while in automatic control.

SUMMARY OF THE INVENTION

In its broadest aspect the present invention is directed to a ramp circuit to limit the slew rate of signals from a controller in a control loop to a controllable means such as a voltage regulator or power pack or final element. The ramp circuit has an input for receiving a signal from a controller in a control loop and an output for sending a signal to the controllable means in a control loop. The ramp circuit is comprised of a storage means having a capacitor to develop a potential in response to receiving a signal from the controller. A reset means is connected to the storage means to provide for discharge of the storage means upon a decrease in power. Optionally, the ramp circuit may include a current control means connected to the storage means to shunt the charging current around the storage means and allow charging of the storage means at a low, uniform current. Also, the ramp circuit can have an external reset means connected in parallel with a potential discharge limiting means of the storage means. The circuit may also have a buffering means connected to receive the controller output signal and connected to the reset means before the output of the ramp circuit to buffer the circuit to avoid discharges of the capacitor in the storage means by the input of the controllable means.

A narrower aspect of the invention is a bushing ramp circuit for limiting the slew rate of a controller's output signal to a power supply to control the temperature of a fiber forming bushing. In this aspect the ramp circuit has an input for receiving the signal from the controller and an output for sending the signal to the power supply. Also, the ramp circuit comprises a storage means having a capacitor to develop a potential in response to receiving the signal from the controller and a reset means connected to the storage means to provide for discharge of the capacitor of the storage means when a decrease in power occurs. Optionally, the circuit may include external reset means, current limiting means, buffering means and may also include component protection means.

DETAILED DESCRIPTION OF THE INVENTION AND PREFERRED EMBODIMENT

Figure 1:
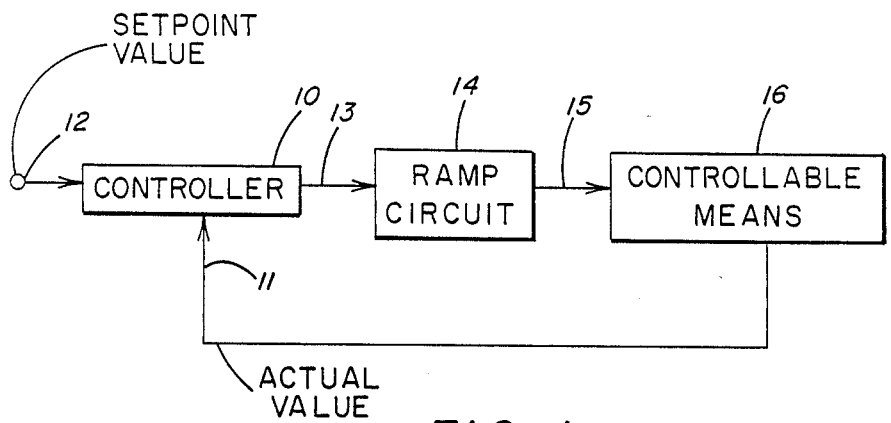
FIG. 1 is a schematic diagram of a control loop incorporating the ramp circuit to receive the signal from the controller and send the signal to the controllable means.

FIG. 1 shows the schematic relationship of the components in the control loop utilizing the broader aspect of the ramp circuit invention. Controller 10 compares an actual value of a monitored variable received by connection 11 to a set point value predetermined and set in the controller at 12 for the same variable. The controller sends a signal by connection 13 to ramp circuit 14. The control signal can be transmitted in connection 13 electronically or pneumatically and generally has a value ranging from 0 to 5 volts or 4 to 20 milliamps or 0 to 10 volts or 5 to 15 psig or 0 to 80 volts. The latter is the control signal when a saturable core reactor is used as the power pack or voltage regulator, not shown in FIG. 1, as part of the controllable means 16. The ramp circuit 14 sends the output having a limited slew rate via connection 15 to controllable means 16. The controllable means can be any final element in a control loop or a combination of a power supply such as a voltage regulator, saturable core reactor or silicon-controlled rectifier. In the latter situation the power supply is modified to control a variable in the final element and the variable is sensed by a sensor not shown in FIG. 1 which conveys the actual value of the variable to controller 10 via connection 11.

Figure 2:
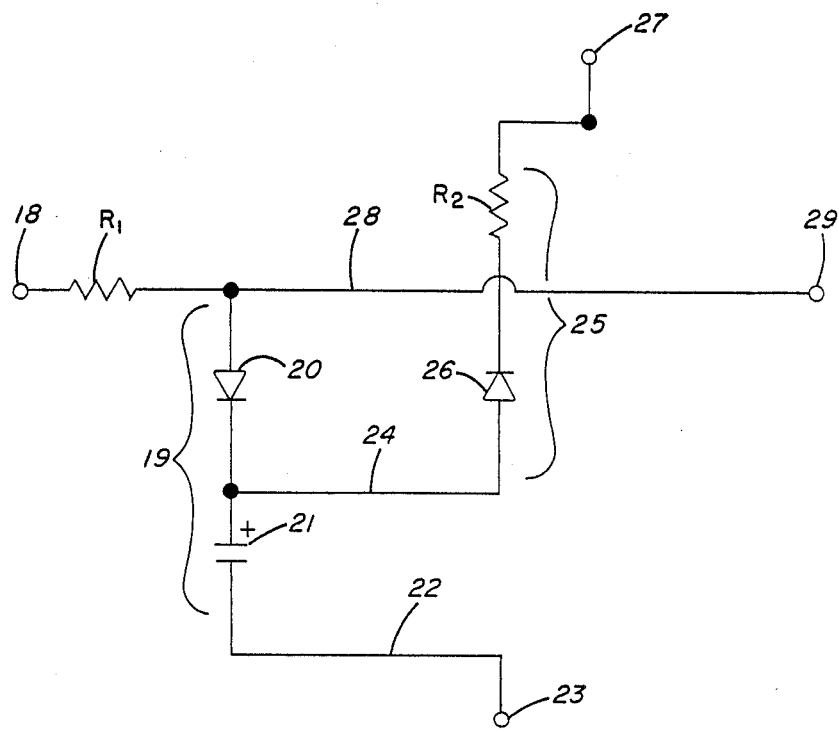
FIG. 2 is a circuit schematic of the broader aspect of the invention including the storage means and the reset means of the ramp circuit along with the input and output.

The ramp circuit 14 of FIG. 1 in its broader aspect is depicted in FIG. 2. The input 18 receives the controller signal which is conveyed through a resistor, $R_1$, to a storage means 19 comprised of diode 20 connected in series at its cathode with a capacitor 21. The other side of the capacitor is connected by connection 22 to ground 23. The storage means is connected via connection 24 to the reset means 25. The reset means is comprised of diode 26 connected in series with resistor $R_2$ to supply voltage or relay contact connection 27. The limited slew rate signal is conveyed by connection 28 to output 29. The output from 29 is conveyed to the controllable means as shown in FIG. 1 through connection 15. The ramp circuit of FIG. 2 provides a time constant to limit the slew rate of the controller output signal. A potential from the output signal is developed in capacitor 21 of FIG. 2 through the forward biased diode 20. The forward biasing in this fashion permits the diode to function as a potential discharge limiting means so that capacitor 21 does not discharge in a short period of time. The reset means 25 has the anode of diode 26 connected between the capacitor 21 and diode 20 to conduct current from the capacitor so that in the case of a decrease in power the capacitor is discharged and thus is reset. Also, the resistor $R_2$ is part of the reset means which dissipates the voltage at connection 27. The value of $R_2$ is chosen to allow for dissipation of the charge of the capacitor upon a reduction of the voltage at connection 27 to below the controller output voltage. The value of resistor $R_1$ is chosen in conjunction with the value of capacitor 21 to obtain a time constant varying from several seconds to an hour.

Figure 3:
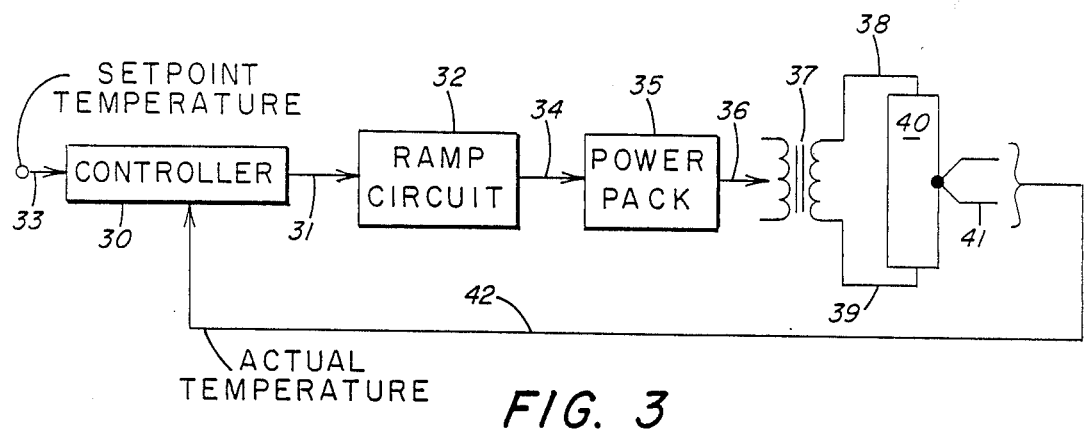
FIG. 3 is a schematic diagram of the control loop for limiting the slew rate of the controller signal in the temperature control of a fiber producing bushing.

FIG. 3 depicts the narrower scope of the invention where the signal from controller 30 has a limited slew rate by ramp circuit 32 in controlling the temperature of a fiber producing bushing. In FIG. 3 the controller 30 has a set point temperature indicated by 33 and receives the actual temperature of the bushing 40 by at least one thermocouple 41 sending a signal to the controller 30 by connection 42. The controller compares the actual temperature to the set point temperature and sends a control output signal ranging from 0 to 5 or 0 to 10 volts or 4 to 20 milliamps where the power pack is a silicon controlled rectifier type or is 0 to 80 volts where the power pack is a saturated core reactor type power pack or the signal could be 5 to 15 psig where the signal is sent pneumatically. An example of a useful controller is that of U.S. Pat. No. 3,202,800 (Phillips, Sr. al). The controller output signal is received by the ramp circuit 32 which can be the ramp circuit depicted in FIG. 2 that gives a limited slew rate output signal to the power pack 35 by connection 34. The power pack responds to the limited slew rate signal and sends a signal to transformer 37 by connection 36 to either increase or decrease the temperature of the bushing 40 by connections 38 and 39. The thermocouple 41 senses the temperature of the bushing and sends its signal of the actual temperature by connection 42 to the controller 30.

Figure 4:
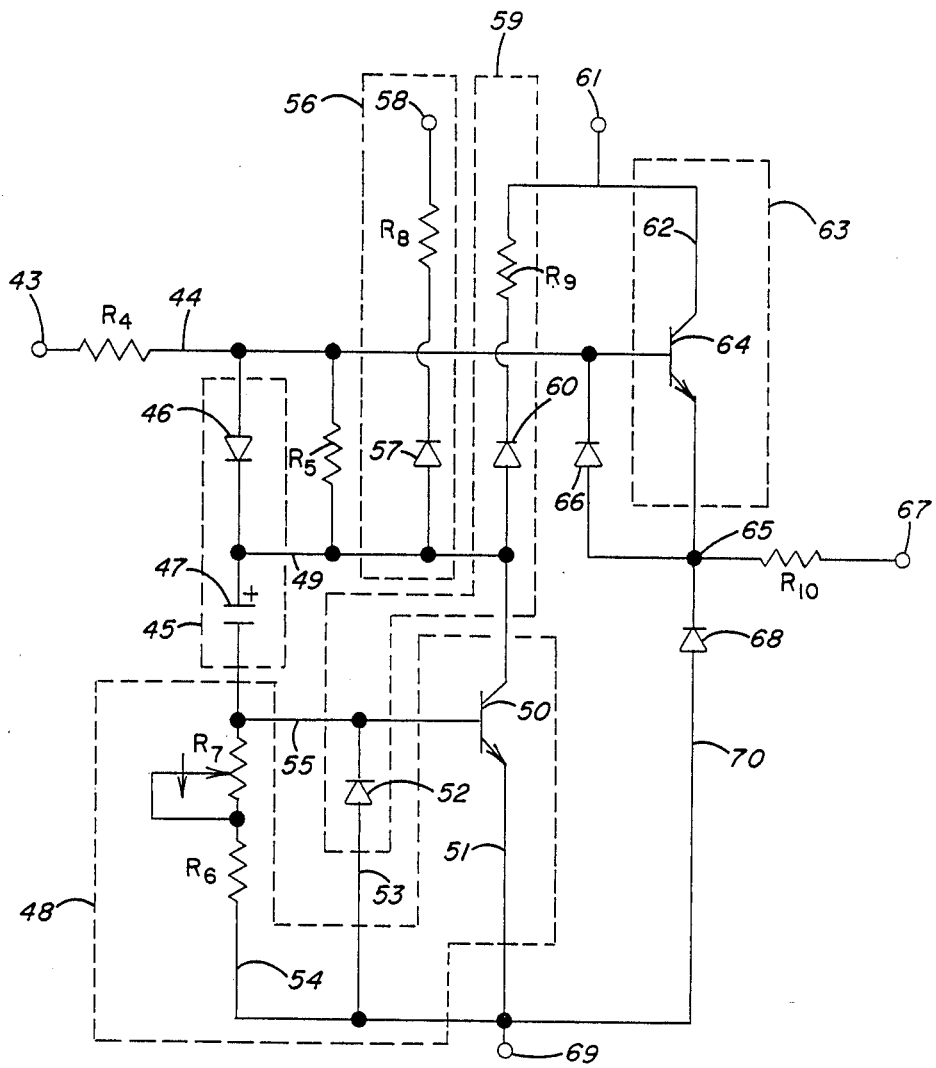
FIG. 4 is a circuit schematic of the narrower aspect of the invention including the input and output for the ramp circuit along with the storage means, current limiting means, reset means, buffering means, external reset means and component protection means.

FIG. 4 depicts the preferred embodiment of the present invention of the ramp circuit as used in the schematic of FIG. 3. The controller output signal is received at input 43 and travels through resistor $R_4$ and wire 44 to storage means 45. The storage means is comprised of a diode 46 and capacitor 47. Connected to the other side of capacitor 47 and also parallel to capacitor 47 is the current limiting means 48. This current limiting means includes resistor $R_6$, potentiometer $R_7$ and type NPN transistor 50. The emitter of transistor 50 is connected to ground 69 through wire 51, and the collector of transistor 50 is connected to the junction of diode 46 and capacitor 47 through wire 49. The base of transistor 50 is connected to the other side of capacitor 47 through wire 55.

Resistor $R_6$ is connected in series with potentiometer $R_7$. Potentiometer $R_7$ is connected to a common point with wire 55 and to the other side of capacitor 47. The other side of resistor $R_6$ is connected to ground 69 through wire 54. From wire 49 is connected an external reset means 56 comprised of diode 57 connected in series with resistor $R_8$ to an output 58. Connected to wire 49 and thereby to the positive side of capacitor 47 is the reset means 59. The reset means 59 is comprised of diode 60 having its anode connected to wire 49 and cathode connected in series with resistor $R_9$ and connected to output 61. Also included in reset means 59 is diode 52 which has its cathode connected to ground 69 through wire 53 and its anode connected to wire 55. Also connected to output 61 by wire 62 is a buffering means 63. The buffering means is comprised of transistor 64 connected to wire 62 through its collector and through its emitter connected to common connection 65. Wire 44 is connected to the base of transistor 64. The protection means is comprised of diodes 66 and 68 and resistor $R_{10}$. The anode of diode 66 is connected to commom connection 65 and the cathode is connected to wire 44. Also, from common point 65 is connected resistor $R_{10}$ which leads to output for the ramp circuit at 67. Connected to common point 65 is the cathode of diode 68 whose anode is connected to ground 69 through wire 70.

The output signal from the controller is received at the input 43. When the bushing is cold and is being heated, the controller output signal which can be functioning in any PID mode goes to a maximum output to achieve the operating temperature of the bushing of around 2100° C. At this point the capacitor 47 of storage means 45 is discharged. The controller signal passes through resistor $R_4$ which preferably has a value of 10K and the capacitor 47 begins to charge through diode 46. The capacitor charging current develops a voltage across resistor $R_6$ and potentiometer $R_7$ of the current limiting means 48 up to a one forward diode drop voltage of around 0.6 to 0.7 volts. At this point transistor 50 turns on to limit the charging current to the capacitor by shunting enough current from the capacitor to ground. The positive side of capacitor 47 ramps up at a linear rate which is fairly uniform. The voltage at the anode side of diode 46 is linearly ramping to a voltage 1 diode drop higher than the capacitor 47. The buffering means 63 buffers the voltage increase at diode 46 and the voltage that is supplied to the output 67 for transmission to the power pack of FIG. 3.

When the temperature of the bushing reaches the set point of the controller, the output of the controller goes to maintain the voltage around the set point temperature. In this case there is no charging current through diode 46 to maintain the one diode drop voltage across diode 46. Resistor $R_5$, which preferably has a value of 10K, conveys the current to the capacitor 47 to charge the capacitor to one additional diode voltage drop. When the capacitor is charged to this control voltage, if the bushing is sprayed with water and the controller output rapidly increases the capacitor 47 would charge and limit the rate of increase of the voltage.

The reset means allows the capacitor to discharge if there is a decrease in power through diode 60 and resistor $R_9$ to output 61 to allow the capacitor to discharge and be reset. The diode 52 is also in the discharge path to allow rapid reset. The value of the potentiometer $R_7$ and resistor $R_6$ of the current limiting means is adjusted to adjust the ramp rate of the current charge in the capacitor. This adjusts how fast the capacitor will increase in voltage up to the control voltage. The charging current will be whatever current is needed to pass through the resistor $R_6$ and potentiometer $R_7$ where $R_7$ can be adjusted to allow for varying ramp rates to generate the voltage drop across the resistor $R_6$ and potentiometer $R_7$ of one diode drop. By increasing the resistance of the potentiometer, it takes less current and slows the ramp rate whereas by decreasing the resistance of the potentiometer $R_7$ it increases the current and increases the ramp rate. The current limiting means charges the storage means at a small, nearly uniform current, i.e., limiter.

The buffering means 63 limits any discharging of capacitor 47 through the power pack input. Preferably, the controller output signal ranges from 0 to 5 volts and resistor $R_6$ has a value of 10K ohms and the potentiometer $R_7$ is a 50K ohm potentiometer. The transistor 50 is Preferably a 2N3904 transistor and the capacitor 47 is 3000 microfarads. In the reset means the resistor $R_9$ at 100 ohms allows for the discharge of the capacitor 47 through output 61 which is the controller supply voltage at about +6.8 volts. The resistance $R_4$ at 10K ohms and the capacitor at 3000 microfarads can be other values selected as a pair to obtain the required charging characteristics.

The external reset means 56, comprised of diode 57 and resistor $R_8$, is connected to the power pack positive voltage terminal. Preferably, $R_8$ has a value of 100 ohms. This allows for external reset by manually discharging the capacitor but allowing the capacitor to charge when the supply voltage does not decrease in the controlled loop. In the buffering means the transistor 64 is preferably a 2N3904 transistor which is biased by the controller output signal in wire 44 at the base of the transistor. Diodes 66 and 68 provide protection to the components from the power pack input at output 67. In the preferred embodiment the power pack is located some distance from the ramp circuit and the wire 34 at output 67 may be subject to induced electrical current. All the diodes are preferably 1N4003 diodes. In the buffering means the emitter follower arrangement of transistor 64 limits the amount of current the power pack would draw so that the power pack does not load down the circuit. In addition, transistor 64 provides additional current. The ramp circuit prevents feeding large output signals from the controller to too rapidly increase the voltage of the power pack.

While the invention has been described with reference to certain specific illustrated embodiments, it is not intended to be limited thereby except insofar as appears in the accompanying claims.

I claim:

1. In a process control loop having a controller to compare an actual value of a monitored variable to a predetermined set point value for that variable and a controllable means, THE IMPROVEMENT COMPRISING:
    a ramp circuit having an input for receiving a controller output signal from the controller in the control loop and an output for sending a ramp circuit output signal to the controllable means to limit the slew rate of the controller output signal and having a storage means with a capacitor to develop a potential in response to receiving the controller output signal from the controller, and having a reset means connected to the storage means to provide a discharge path for said capacitor in the event of a decrease in power to the control loop.

2. Apparatus of claim 1, where said ramp circuit has a resistance at its input, and wherein the storage means is comprised of said capacitor and a diode having its anode connected in series with said input resistance and having its cathode connected in series to the positive end of said capacitor.

3. Apparatus of claim 1, wherein the reset means is comprised of a diode and a resistance, where the diode has its anode connected to the positive terminal of the capacitor of the storage means and its cathode connected in series with said resistance that is connected in series at its other end to a connection to allow for dissipation of charge from said capacitor of the storage means when the voltage at said connection is below the voltage of the controller output signal.

4. Apparatus of claim 1, which includes a current limiting means connected to shunt current from the storage means in response to the controller output signal and allow charging of said capacitor of the storage means at a low linear rate.

5. Apparatus of claim 3, which includes a current limiting means connected to shunt current from the storage means in response to the controller output signal and allow charging of said capacitor of the storage means at a low linear rate, and wherein the reset means has a second diode having its cathode connected to ground and is anode connected with said current limiting means, and wherein the current limiting means comprises:
    a transistor connected to shunt current around the storage means where the collector of said transistor is connected to the positive side of said capacitor and where the emitter of said transistor is connected to ground and where the base is connected to the negative side of said capacitor of the storage means, and
    serially connected resistors connected in parallel with said second diode of the reset means, where said diode has its anode connected to the base of said transistor and its cathode connected to ground as is the emitter of the transistor, and where the serially connected resistors have one end, where the resistor at this end is a potentiometer, connected to the negative side of said capacitor of the storage means as is the base of said transistor and have the other end of the serially connected resistors connected to ground as is the emitter of the transistor.

6. Apparatus of claim 1 which includes an external reset means having a resistance serially connected to a diode and connected to receive the controller output signal through a resistance at the input of the ramp circuit that is connected with the anode of said diode whose anode is also connected to the positive side of said capacitor of said storage means.

7. Apparatus of claim 1, wherein part of the controllable means includes a power pack, and where the ramp circuit includes additional resistances, a buffering means, and a protection means,
   where the buffering means limits the discharge of the storage means by the powerpack input, and where the buffering means has a transistor having its collector connected to the controller for positive supply voltage for biasing and has its base connected to receive the controller output signal through one of the additional resistances for the ramp circuit at the input of the ramp circuit and has its emitter connected to the power pack input through another of said additional resistances of the ramp circuit, and
   where said protection means is comprised of a diode having the cathode connected to the base of said transistor of the buffering means and the anode connected to the emitter and a second diode having the cathode connected to the emitter of the transistor of the buffering means and the anode connected to signal ground.

8. A ramp circuit having an input for receiving a signal from a controller in a control loop that controls the temperature of a fiber producing bushing and having an output for sending a signal to the power supply that supplies power to the bushing where the ramp circuit limits the slew rate of the controller output signal, comprising:
   a. an input having a resistance connected to the input for receiving a controller output signal from the controller in the control loop,
   b. a storage means having a capacitor to develop a potential in response to receiving said output signal from the controller, and
   c. reset means connected to the storage means to provide for a discharge path of the voltage of said capacitor of the storage means upon a decrease in power to the control loop,
   d. a current limiting means connected to shunt current from said capacitor of the storage means in response to the controller output signal and allow charging of said capacitor of the storage means at a low liner rate of current flow,
   e. a buffering means comprised of a transistor, where the transistor is connected in emitter-follower fashion having the collector connected to a voltage source and an emitter connected to the power supply through a resistance and a base which is connected to receive the controller output signal through a resistance for biasing,
   f. an external reset means which is comprised of a diode connected in series with a resistance and connected to the positive supply voltage of the power supply, where the anode of said diode is connected to another resistance of the ramp circuit which is connected in series to said input resistance and also is connected to the positive side of said capacitor of the storage means, and
   g. an output for sending a ramp circuit output signal to the controllable means with a power supply that supplies power to the bushing so that the ramp circuit limits the slew rate of the controller output signal.

9. Apparatus of claim 8, wherein the storage means is comprised of said capacitor and a diode, where the diode has its anode connected in series with said input resistance and has its cathode connected in series to the positive end of said capacitor of the storage means.

10. Apparatus of claim 8, wherein the reset means is comprised of a diode and a resistance, where the diode has its anode connected to the positive terminal of the capacitor of the storage means and its cathode connected in series with said resistance connected in series at its other end to a connection to allow for dissipation of charge from said capacitor of the storage means when the voltage at said connection is below the voltage of the controller output signal.

11. Apparatus of claim 11, wherein the reset means has a second diode having its cathode connected to ground and is anode connected with said current limiting means, and wherein the current limiting means comprises;
   a transistor connected to shunt current around the storage means where the collector of said transistor is connected to the positive side of said capacitor and where the emitter of said transistor is connected to ground and where the base is connected to the negative side of said capacitor of the storage means, and
   serially connected resistors connected in parallel with said second diode of the reset means, where said diode has its anode connected to the base of said transistor and its cathode connected to ground as is the emitter of the transistor, and where the serially connected resistors have one end, where the resistor at this end is a potentiometer, connected to the negative side of said capacitor of the storage means as is the base of said transistor and have the other end of the serially connected resistors connected to ground as is the emitter of the transistor..

12. Apparatus of claim 8, wherein the buffering means includes a protection means comprised of a diode having the cathode connected to the base of said transistor of the buffering means and the anode connected to the emitter and a second diode having the cathode connected to the emitter of the transistor of the buffering means and the anode connected to signal ground.

13. A ramp circuit having an input for receiving a signal from a controller in a control loop and an output for sending a signal to a controllable means in a control loop to limit the slew rate of the controller signal, comprising:
   a. an input having a resistance connected to the input for receiving a controller output signal from the controller in the control loop,
   b. a storage means having a capacitor to develop a potential in response to receiving an output signal from the controller,
   c. a reset means connected to the storage means to provide a discharge path for said capacitor of the storage means in the event of a decrease in power in the control loop,
   d. a current limiting means connected to shunt current from the storage means in response to the controller output signal thereby allowing the charging of the capacitor of the storage means at a low linear rate, and e. an output for sending a ramp circuit output signal to the controllable means so that the ramp circuit limits the slew rate of the controller output signal.

14. Apparatus of claim 13, wherein the storage means is comprised of said capacitor and a diode having its anode connected in series with said input resistance and having its cathode connected in series to the positive end of said capacitor.

15. Apparatus of claim 13, wherein the reset means is comprised of a diode and a resistance, where the diode has its anode connected to the positive terminal of the capacitor of the storage means and its cathode connected in series with said resistance that is connected in series at its other end to a connection to allow for dissipation of charge from said capacitor of the storage means when the voltage at said connection is below the voltage of the controller output signal.

16. Apparatus of claim 15, wherein the reset means has a second diode having its cathode connected to ground and is mode connected with said current limiting means, and wherein the current limiting means comprises;

a transistor connected to shunt current around the storage means where the collector of said transistor is connected to the positive side of said capacitor and where the emitter of said transistor is connected to ground and where the base is connected to the negative side of said capacitor of the storage means, and serially connected resistors connected in parallel with said second diode of the reset means, where said diode has its anode connected to the base of said transistor and its cathode connected to ground as is the emitter of the transistor, and where the serially connected resistors have one end, where the resistor at this end is a potentiometer, connected to the negative side of said capacitor of the storage means as is the base of said transistor and have the other end of the serially connected resistors connected to ground as is the emitter of the transistor.

17. Apparatus of claim 13, which includes an external reset means having a resistance serially connected to a diode and connected to receive the controller output signal through a resistance at the input of the ramp circuit that is connected with the anode of said diode whose anode is also connected to the positive side of said capacitor of said storage means.

18. Apparatus of claim 13, wherein part of the controllable means includes a power pack, and where the ramp circuit includes additional resistances, a buffering means, and a protection means, where the buffering means limits the discharge of the storage means by the power pack input, and where the buffering means has a transistor having its collector connected to the controller for positive supply voltage for biasing and has its base connected to receive the controller output signal through one of the additional resistances for the ramp circuit at the input of the ramp circuit and has its emitter connected to the power pack input through another of said additional resistances of the ramp circuit, and where said protection means is comprised of a diode having the cathode connected to the base of said transistor of the buffering means and the anode connected to the emitter and a second diode having the cathode connected to the emitter of the transistor of the buffering means and the anode connected to signal ground.

19. A ramp circuit having an input for receiving a signal from a controller in a control loop and an output for sending a signal to a controllable means involving a final element in a control loop to limit the slew rate of the controller signal, comprising:

a. a storage means having a capacitor to develop a potential in response to receiving an output signal from the controller, and b. a reset means connected to the storage means to provide a discharge path for said capacitor of the storage means in the event of a decrease in power to the control loop, and c. an external reset means having a resistance serially connected to a diode through its cathode and connected to receive the controller output signal through a resistance at the input of the ramp circuit that is connected with the anode of said diode whose anode is also connected to the positive side of said capacitor of said storage means.

20. Apparatus of claim 19, where said ramp circuit has a resistance at its input, and wherein the storage means is comprised of said capacitor and a diode having its anode connected in series with said input resistance and having its cathode connected in series to the positive end of said capacitor.

21. Apparatus of claim 19, wherein the reset means is comprised of a diode and a resistance, where the diode has its anode connected to the positive terminal of the capacitor of the storage means and its cathode connected in series with said resistance that is connected in series at its other end to a connection to allow for dissipation of charge from said capacitor of the storage means when the voltage at said connection is below the voltage of the controller output signal.

22. Apparatus of claim 19, which includes a current limiting means connected to shunt current from the storage means in response to the controller output signal and allow charging of said capacitor of the storage means at a low linear rate.

23. Apparatus of claim 21, which includes a current limiting means connected to shunt current from the storage means in response to the controller output signal and allow charging of said capacitor of the storage means at a low linear rate, and wherein the reset means has a second diode having its cathode connected to ground and is anode connected with said current limiting means, and wherein the current limiting means comprises;

a transistor connected to shunt current around the storage means where the collector of said transistor is connected to the positive side of said capacitor and where the emitter of said transistor is connected to ground and where the base is connected to the negative side of said capacitor of the storage means, and serially connected resistors connected in parallel with said second diode of the reset means, where said diode has its anode connected to the base of said transistor and its cathode connected to ground as is the emitter of the transistor, and where the serially connected resistors have one end, where the resistor at this end is a potentiometer, connected to the negative side of said capacitor of the storage means as is the base of said transistor and have the other end of the serially connected resistors connected to ground as is the emitter of the transistor.

24. Apparatus of claim 19, wherein part of the controllable means includes a power pack, and where the ramp circuit includes additional resistances, a buffering means, and a protection means, where the buffering means limits the discharge of the storage means by the power pack input, and where the buffering means has a transistor having its collector connected to the controller for positive supply voltage for biasing and has its base connected to receive the controller output signal through one of the additional resistances for the ramp circuit at the input of the ramp circuit and has its emitter connected to the power pack input through another of said additional resistances of the ramp circuit, and where said protection means is comprised of a diode having the cathode connected to the base of said transistor of the buffering means and the anode connected to the emitter and a second diode having the cathode connected to the emitter of the transistor of the buffering means and the anode connected to signal ground.

* * * * *

UNITED STATES PATENT AND TRADEMARK OFFICE
CERTIFICATE OF CORRECTION

PATENT NO. : 4,978,866

DATED : December 18, 1990

INVENTOR(S) : John J. Kuhn

It is certified that error appears in the above-identified patent and that said Letters Patent is hereby corrected as shown below:

Title page, item [57],
Abstract, line 12, delete "lower" and insert --low--.

Column 7, line 15, delete "powerpack" and insert --power pack--.

Column 7, line 53, delete "liner" and insert --linear--.

Column 8, line 20, delete "11" and insert --10--.

Column 8, line 65, delete "in" and insert --to--.

Column 9, line 24, delete ";" and insert --:-- after comprises.

Column 10, line 52, delete ";" and insert --:-- after comprises.

Signed and Sealed this

Second Day of September, 1997

Attest:

Attesting Officer

BRUCE LEHMAN

Commissioner of Patents and Trademarks